United States Patent
Kamada et al.

(10) Patent No.: US 9,305,795 B2
(45) Date of Patent: Apr. 5, 2016

(54) PLASMA PROCESSING METHOD

(71) Applicant: Tokyo Electron Limited, Tokyo (JP)

(72) Inventors: Tomiko Kamada, Miyagi (JP); Hiroto Ohtake, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/474,593

(22) Filed: Sep. 2, 2014

(65) Prior Publication Data

US 2015/0064926 A1  Mar. 5, 2015

(30) Foreign Application Priority Data

Sep. 4, 2013  (JP) ................. 2013-183276

(51) Int. Cl.
*H01L 21/3065* (2006.01)
*H01J 37/32* (2006.01)
*H01L 21/311* (2006.01)
*H01L 29/66* (2006.01)

(52) U.S. Cl.
CPC ....... *H01L 21/3065* (2013.01); *H01J 37/32192* (2013.01); *H01L 21/31116* (2013.01); *H01L 29/66545* (2013.01)

(58) Field of Classification Search
USPC .............................. 216/67, 69; 438/710, 726
See application file for complete search history.

(56) References Cited

U.S. PATENT DOCUMENTS

| | | | |
|---|---|---|---|
| 7,718,538 B2 | 5/2010 | Kim et al. | |
| 7,737,042 B2 | 6/2010 | Kim et al. | |
| 8,906,760 B2 * | 12/2014 | Ranjan et al. | 438/197 |
| 2005/0139938 A1 | 6/2005 | Kim | |
| 2013/0001197 A1 * | 1/2013 | Inoue et al. | 216/67 |
| 2013/0029494 A1 | 1/2013 | Sasaki | |
| 2013/0164940 A1 | 6/2013 | Raley | |
| 2013/0267046 A1 * | 10/2013 | Or-Bach et al. | 438/14 |
| 2014/0231914 A1 * | 8/2014 | Chang et al. | 257/347 |
| 2014/0329390 A1 * | 11/2014 | Inoue et al. | 438/711 |

* cited by examiner

*Primary Examiner* — Shamim Ahmed
(74) *Attorney, Agent, or Firm* — Pearne & Gordon LLP

(57) ABSTRACT

A plasma processing method can etch regions having different densities at the same etching rates. When etching with surface wave plasma, both of layers contain Si and N, a processing gas includes a hydro fluorocarbon gas, a rare gas, and an oxygen gas, and a high frequency bias potential is applied to a preset location at a side of a substrate. Further, a power per unit area of the substrate, which generates the high frequency bias potential, is set to be about 0 W/m² or more to about 400 W/m² or less.

4 Claims, 10 Drawing Sheets

PLASMA PROCESSING METHOD

CROSS-REFERENCE TO RELATED APPLICATION

This application claims the benefit of Japanese Patent Application No. 2013-183276 filed on Sep. 4, 2013, the entire disclosures of which are incorporated herein by reference.

TECHNICAL FIELD

The embodiments described herein pertain generally to a plasma processing method and more particularly, to a plasma processing method of performing an etching process with surface wave plasma.

BACKGROUND

The conventional etching methods are described in, for example, Patent Document 1 or Patent Document 2. Patent Document 1 describes an etching method in which a pulse plasma process is performed on a first layer of a sample and a continuous plasma process is performed on a second layer to remove a part of these layers. Since the layers in Patent Document 1 have different compositions, the different plasma processes are performed. Patent Document 2 describes an etching method in which a continuous plasma process is intermittently carried out.

Patent Document 1: Specification of U.S. Pat. No. 7,737,042
Patent Document 2: Specification of U.S. Pat. No. 7,718,538

However, if there are different compositions, the densities thereof are also different. Therefore, when these layers are etched at the same time, there is a difference in etching rates. Recently, along with the development of a manufacturing technology for electronic elements such as a fin-type transistor, there has been an increasing demand for a technology of etching regions having different densities at the same etching rates.

SUMMARY

In view of the foregoing, there is provided a plasma processing method capable of etching regions having different densities at the same etching rates.

In one example embodiment, a plasma processing method includes preparing a substrate on which a first layer and a second layer having different densities are formed; arranging the substrate within a processing chamber and introducing a processing gas for etching into the processing chamber; and generating surface wave plasma by exciting the processing gas with a microwave at a position spaced away from the substrate and etching the first layer and the second layer at the same time with the plasmarized processing gas. Further, both of the first layer and the second layer contain Si and N, and the processing gas includes a hydro fluorocarbon gas, a rare gas, and an oxygen gas. Furthermore, during the etching of the first layer and the second layer, a high frequency bias potential is applied to a predetermined location at a side of a substrate such that the plasmarized processing gas is directed toward the substrate, and a power per unit area of the substrate, which generates the high frequency bias potential, is about 0 $W/m^2$ or more to about 400 $W/m^2$ or less.

In accordance with this plasma processing method, when using the surface wave plasma, the hydro fluorocarbon gas and the oxygen gas contained in the processing gas react with the Si and the N contained in the first layer and the second layer to etch these layers. Herein, since the power per unit area (power density), which generates the high frequency bias potential, is set to be a certain range as described above, the first layer and the second layer having different densities can be etched at the same etching rates.

Further, the hydro fluorocarbon gas may include $CHF_3$, $CH_2F_2$, or $CH_3F$, which may be used alone or in combination. The rare gas may include Ar, He, Xe, or Kr, which may be used alone or in combination. Each of the first layer and the second layer may be made of $SiN_x$, SiCN, SiON, or SiOCN.

Furthermore, a forming method of the first layer may be different from a forming method of the second layer. That is, the first layer and the second layer may have different densities and may be formed by the different forming methods.

Moreover, the forming method of the first layer may be a chemical vapor deposition (CVD) method, and the forming method of the second layer may be an atomic layer deposition (ALD) method or a molecular layer deposition (MLD) method. The first layer and the second layer respectively formed by these forming methods may have different densities. Along with the development of the semiconductor device manufacturing technology, products manufactured by these different forming methods have been increased. In this case, the present disclosure is more useful.

In the example embodiment, a first insulating layer formed on a top surface of a gate uprightly provided on the substrate may serve as the first layer, a second insulating layer adjacent to side surfaces of the gate may serve as the second layer, and all of the first layer and a part of the second layer may be removed by the etching.

A fin-type transistor includes a fin-type semiconductor conductive region and a gate electrode extended in a direction orthogonal to a longitudinal direction of the semiconductor conductive region. While forming the gate electrode, the first insulating layer is formed by the CVD method as a cap on a top surface of a dummy gate electrode corresponding to the gate electrode and the second insulating layer is formed by the ALD method or the MLD method at the side surfaces of the gate electrode. Then, until the first insulating layer is removed, these layers are etched at the same time to remove all of the first insulating layer and a part of the second insulating layer.

Based on the principle that the first layer and the second layer can be etched at the same etching rates, even if a first region and a second region having different densities are present within a single layer, these regions can also be etched at the same etching rates in like manner.

That is, a plasma processing method includes preparing a substrate having a layer that includes a first region and a second region having different densities; arranging the substrate within a processing chamber and introducing a processing gas for etching into the processing chamber; and generating surface wave plasma by exciting the processing gas with a microwave at a position spaced away from the substrate and etching the layer with the plasmarized processing gas. Further, both of the first region and the second region contain Si and N, and the processing gas includes a hydro fluorocarbon gas, a rare gas, and an oxygen gas. Furthermore, during the etching of the layer, a high frequency bias potential is applied to a predetermined location at a side of a substrate such that the plasmarized processing gas is directed toward the substrate, and a power per unit area of the substrate, which generates the high frequency bias potential, is about 0 $W/m^2$ or more to about 400 $W/m^2$ or less.

In accordance with this plasma processing method, when using the surface wave plasma, the hydro fluorocarbon gas and the oxygen gas contained in the processing gas react with the Si and the N contained in the first region and the second region to etch these regions. Herein, since the power per unit area (power density), which generates the high frequency bias potential, is set to be a certain range as described above, the first region and the second region having different densities can be etched at the same etching rates.

In accordance with the plasma processing method of the example embodiments, the regions having different densities can be etched at the same etching rates.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
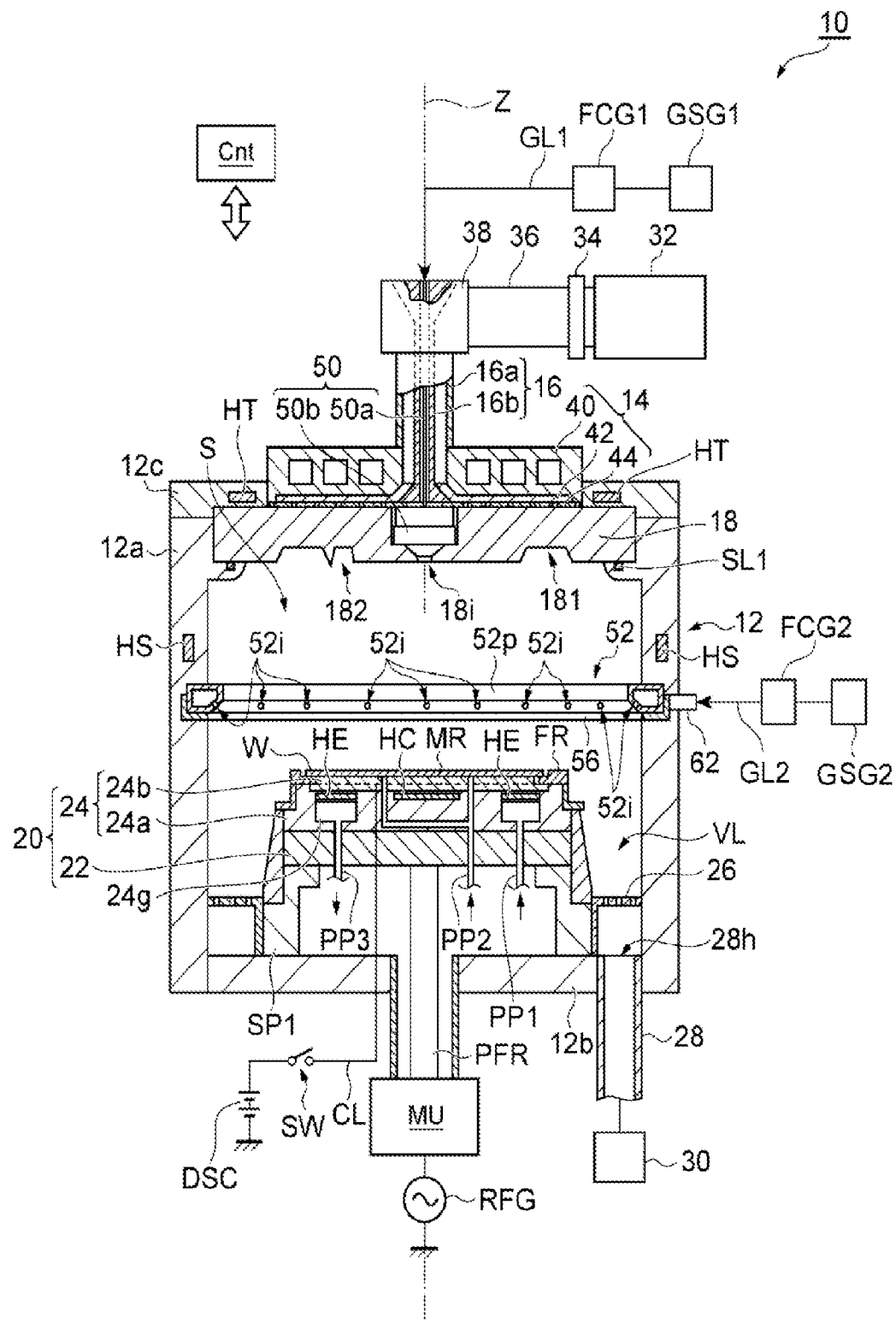
FIG. 1 is a schematic cross sectional view of a plasma processing apparatus in accordance with an example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

A plasma processing method in accordance with an example embodiment is performed in a plasma processing apparatus developed by the applicants of the present application, so that the plasma processing apparatus will be explained first and then, the plasma processing method will be explained.

(Plasma Processing Apparatus)

FIG. 1 is a schematic cross sectional view of a plasma processing apparatus in accordance with the example embodiment.

A plasma processing apparatus 10 illustrated in FIG. 1 includes a processing chamber 12. In the processing chamber 12, a processing space S for accommodating the wafer W is formed. The processing chamber 12 may include a sidewall 12a, a bottom portion 12b, and a ceiling portion 12c.

The sidewall 12a has a substantially cylindrical shape extending in a direction in which an axis line Z extends (hereinafter, referred to as "axis line Z direction"). An inner diameter of the sidewall 12a is, for example, about 540 mm. The bottom portion 12b is provided at a lower end side of the sidewall 12a. An upper end of the sidewall 12a has an opening. The opening of the upper end of the sidewall 12a is closed by a dielectric window 18. The dielectric window 18 is held between the upper end of the sidewall 12a and the ceiling portion 12c. Between the dielectric window 18 and the upper end of the sidewall 12a, a sealing member SL1 may be interposed. The sealing member SL1 is, for example, an O-ring and configured to seal the processing chamber 12.

The plasma processing apparatus 10 further includes a mounting table 20. The mounting table 20 is provided under the dielectric window 18 within the processing chamber 12. The mounting table 20 includes a plate 22 and an electrostatic chuck 24.

The plate 22 is a metallic member having a substantial disc shape and made of, for example, aluminum. The plate 22 is supported by a cylindrical supporting member SP1. The supporting member SP1 extends vertically upwards from the bottom portion 12b. The plate 22 serves as a high frequency electrode. The plate 22 is electrically connected to a high frequency power supply RFG, which generates a high frequency bias power, via a matching unit MU and a power supply rod PFR. The high frequency power supply RFG supplies the high frequency bias power having a certain frequency of, for example, about 13.56 MHz suitable for controlling energy of ions attracted to the wafer W. The matching unit MU accommodates a matching device configured to match an impedance of the high frequency power supply RFG with a load impedance such as mainly an electrode, plasma, and the processing chamber 12. A blocking capacitor for generating self-bias is included within the matching device.

Further, the high frequency power supply RFG is configured to supply a high frequency voltage between the ground and a predetermined location, i.e. a high frequency potential is applied to the predetermined location. Herein, the predetermined location includes the mounting table 20 and a wafer W (substrate) mounted thereon. Furthermore, a power per unit area of the substrate (power density) PD is about 0 W/m$^2$ or more to about 400 W/m$^2$ or less (0 W/m$^2$≤PD≤400 W/m$^2$). The power density PD may be greater than 0 W/m$^2$. Further, the power density PD can be obtained by dividing a power P of the high frequency power supply RFG by an area S of the mounting table 20 (PD=P/S). Furthermore, a potential around a plasma generating source, i.e. a potential of an injector 50b of a central inlet unit 50, is set to be ground.

At an upper surface of the plate 22, the electrostatic chuck 24 is provided. The electrostatic chuck 24 includes a base plate 24a and a chuck portion 24b. The base plate 24a is a metallic member having a substantial disc shape and made of, for example, aluminum. The base plate 24a is provided on the plate 22. At an upper surface of the base plate 24a, the chuck portion 24b is provided. An upper surface of the chuck portion 24b serves as a mounting region MR on which the wafer W is mounted. The chuck portion 24b is configured to hold the wafer W with an electrostatic adsorptive force. The chuck portion 24b includes an electrode film interposed between dielectric films. The electrode film of the chuck portion 24b is electrically connected to a DC power supply DSC via a switch SW and a coated line CL. The chuck portion 24b attracts and holds the wafer W on an upper surface thereof with a Coulomb force generated by a DC voltage applied from the DC power supply DSC. A focus ring FR annularly surrounding an edge portion of the wafer W is provided diametrically outside the chuck portion 24b.

Within the base plate 24a, an annular coolant path 24g extending in a circumferential direction thereof is formed. A coolant, for example, cooling water, having a certain temperature is supplied from a chiller unit through pipes PP1 and PP3 to be circulated through the coolant path 24g. As a result, a process temperature of the wafer W on the chuck portion 24b can be controlled by a temperature of the coolant. Further, a heat transfer gas, for example, a He gas, is supplied between the upper surface of the chuck portion 24b and a rear surface of the wafer W from a heat transfer gas supply unit through a supply pipe PP2.

Around the mounting table 20, an annular exhaust path VL is formed. At a portion of the exhaust path VL in the axis line Z direction, an annular baffle plate 26 having multiple through holes is provided. The exhaust path VL is connected to an exhaust line 28 having an exhaust opening 28h. The exhaust line 28 is provided at the bottom portion 12b of the processing chamber 12. The exhaust line 28 is connected to an exhaust device 30. The exhaust device 30 includes a pressure controller and a vacuum pump such as a turbo molecular pump. The processing space S within the processing chamber 12 can be depressurized to a certain vacuum level by the exhaust device 30. Further, a gas can be exhausted from an outer periphery of the mounting table 20 through the exhaust path VL by operating the exhaust device 30.

Further, the plasma processing apparatus 10 may further include heaters HT, HS, HC, and HE as temperature controllers. The heater HT is provided within the ceiling portion 12c and annularly extends to surround an antenna 14. Further, the heater HS is provided within the sidewall 12a and annularly extends. The heater HC is provided within the base plate 24a. The heater HC is provided under a central portion of the mounting region MR, i.e., at a region through which the axis line Z is passed, within the base plate 24a. Furthermore, the heater HE is provided within the base plate 24a and annularly extends to surround the heater HC. The heater HE is provided under an outer periphery portion of the mounting region MR.

Further, the plasma processing apparatus 10 may further include the antenna 14, a coaxial waveguide 16, the dielectric window 18, a microwave generator 32, a tuner 34, a waveguide 36, and a mode converter 38. The microwave generator 32 is configured to generate a microwave having a frequency of, for example, about 2.45 GHz. The microwave generator 32 is connected to an upper portion of the coaxial waveguide 16 via the tuner 34, the waveguide 36 and the mode converter 38. A central axis line of the coaxial waveguide 16 is the axis line Z and extends along the axis line Z. In the example embodiment, a center of the mounting region MR of the mounting table 20 is positioned on the axis line Z.

The coaxial waveguide 16 includes an external conductor 16a and an internal conductor 16b. The external conductor 16a has a cylindrical shape extending along the axis line Z. A lower end of the external conductor 16a may be electrically connected to an upper portion of a cooling jacket 40 including a conductive surface. The internal conductor 16b is provided inside the external conductor 16a to be coaxial with the external conductor 16a. The internal conductor 16b has a cylindrical shape extending along the axis line Z. A lower end of the internal conductor 16b is connected to a slot plate 44 of the antenna 14.

In the example embodiment, the antenna 14 is a radial line slot antenna. The antenna 14 is positioned within the opening formed at the ceiling portion 12c and is also provided on an upper surface of the dielectric window 18. The antenna 14 includes a dielectric plate 42 and the slot plate 44. The dielectric plate 42 is configured to shorten a wavelength of a microwave and has a substantial disc shape. The dielectric plate 42 is made of, for example, quartz or alumina. The dielectric plate 42 is held between the slot plate 44 and a lower surface of the cooling jacket 40. Accordingly, the antenna 14 includes the dielectric plate 42, the slot plate 44 and the lower surface of the cooling jacket 40.

Figure 2:
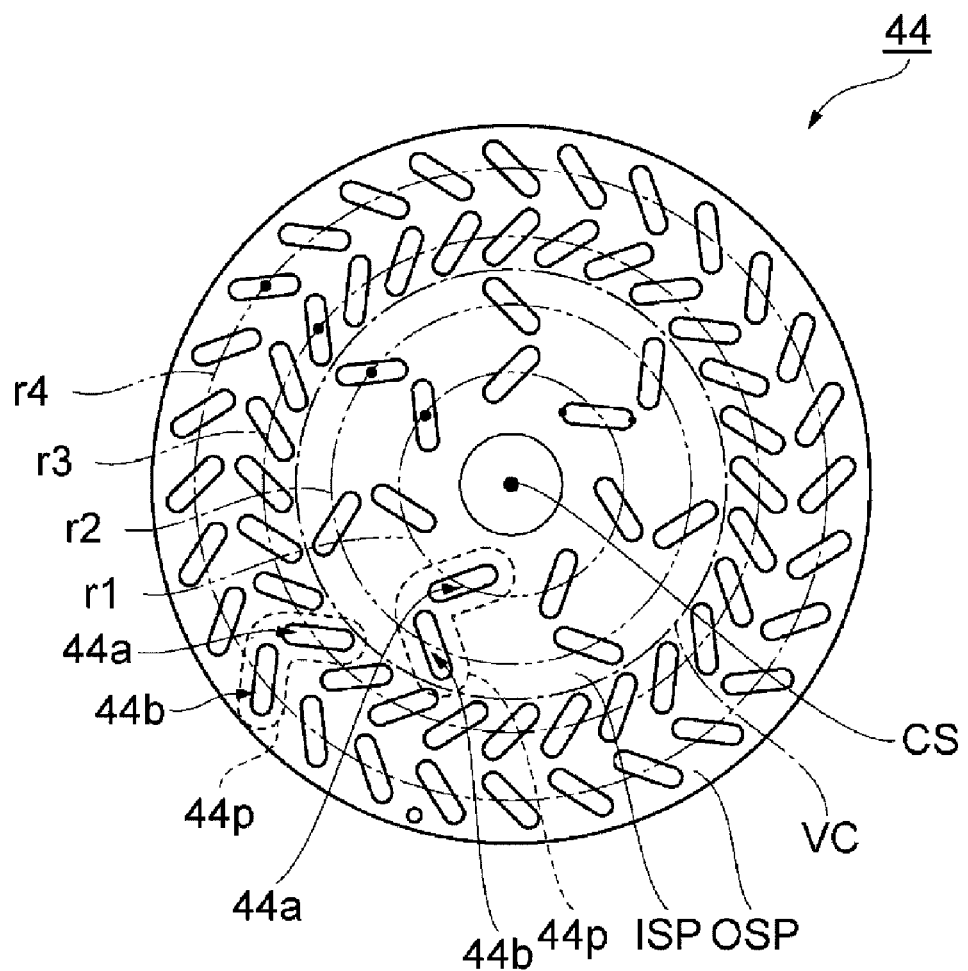
FIG. 2 is a plane view illustrating an example of a slot plate.

FIG. 2 is a plane view illustrating an example of the slot plate. The slot plate 44 has a thin plate shape and disc shape. Both surfaces of the slot plate 44 in a plate thickness direction are flat. A center CS of the circular slot plate 44 is positioned on the axis line Z. The slot plate 44 includes multiple slot pairs 44p. Each of the slot pairs 44p includes two slot holes 44a and 44b penetrating through the slot plate 44. Each of the slot holes 44a and 44b has an elongated hole shape when viewed from the plane. In each of the slot pairs 44p, a direction in which a major axis of the slot hole 44a extends and a direction in which a major axis of the slot hole 44b extends are intersected with each other or orthogonal to each other.

In the example embodiment as illustrated in FIG. 2, the multiple slot pairs 44p are divided into an inner slot pair group ISP arranged inside a virtual circle VC around the axis line Z and an outer slot pair group OSP arranged outside the virtual circle VC. The inner slot pair group ISP includes multiple slot pairs 44p. In the example embodiment as illustrated in FIG. 2, the inner slot pair group ISP includes seven slot pairs 44p. The multiple slot pairs 44p belonging to the inner slot pair group ISP are equally spaced in a circumferential direction with respect to the center CS. Further, multiple slot holes 44a belonging to the inner slot pair group ISP are equally spaced such that centers of the slot holes 44a are positioned on a circle having a radius r1 from the center CS of the slot plate 44. Further, multiple slot holes 44b belonging to the inner slot pair group ISP are equally spaced such that centers of the slot holes 44b are positioned on a circle having a radius r2 from the center CS of the slot plate 44. Herein, the radius r2 is greater than the radius r1.

The outer slot pair group OSP includes multiple slot pairs 44p. In the example embodiment as illustrated in FIG. 2, the outer slot pair group OSP includes twenty eight slot pairs 44p. The multiple slot pairs 44p belonging to the outer slot pair group OSP are equally spaced in the circumferential direction with respect to the center CS. Further, multiple slot holes 44a belonging to the outer slot pair group OSP are equally spaced such that centers of the slot holes 44a are positioned on a circle having a radius r3 from the center CS of the slot plate 44. Further, multiple slot holes 44b belonging to the outer slot pair group OSP are equally spaced such that centers of the slot holes 44*b* are positioned on a circle having a radius r4 from the center CS of the slot plate 44. Herein, the radius r3 is greater than the radius r2, and the radius r4 is greater than the radius r3.

Further, each slot hole 44*a* belonging to the inner slot pair group ISP and the outer slot pair group OSP is arranged such that a long side thereof has the same angle with respect to a line segment connecting the center of each slot hole 44*a* and the center CS. Furthermore, each slot hole 44*b* belonging to the inner slot pair group ISP and the outer slot pair group OSP is arranged such that the long side thereof has the same angle with respect to a line segment connecting the center of each slot hole 44*b* and the center CS.

Figure 3:
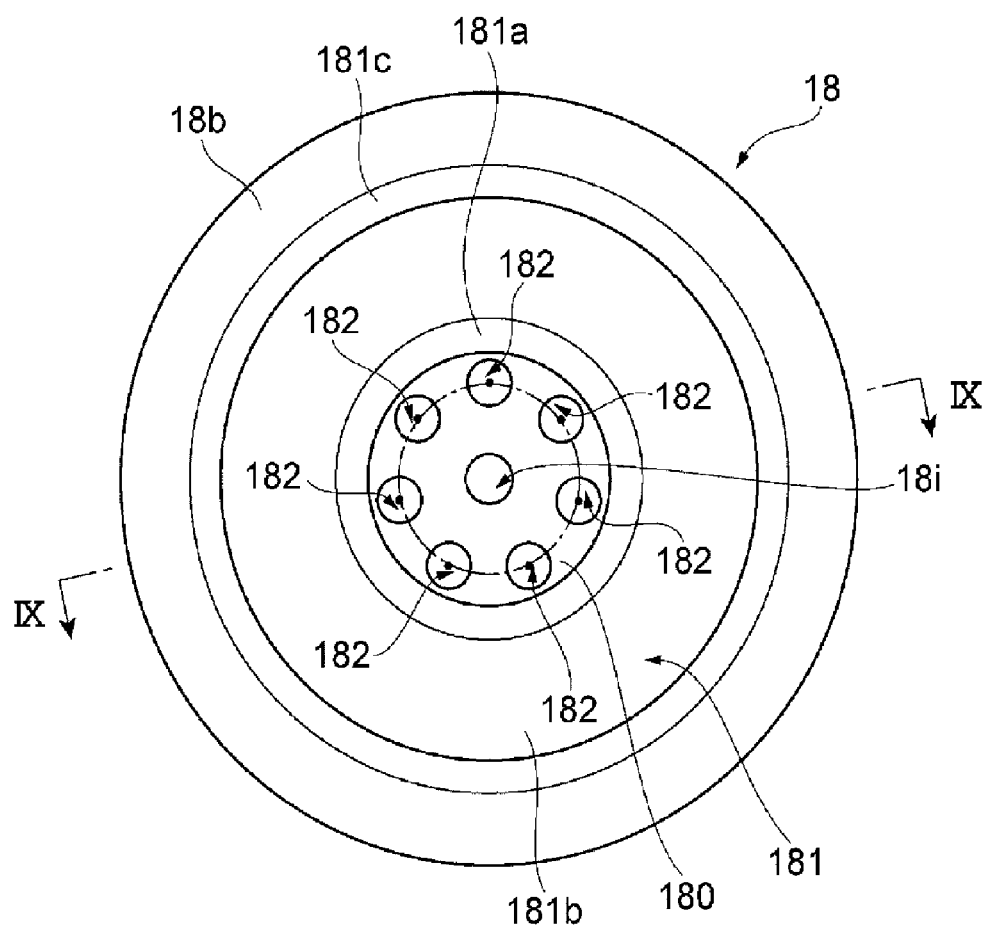
FIG. 3 is a plane view illustrating an example of a dielectric window.
Figure 4:
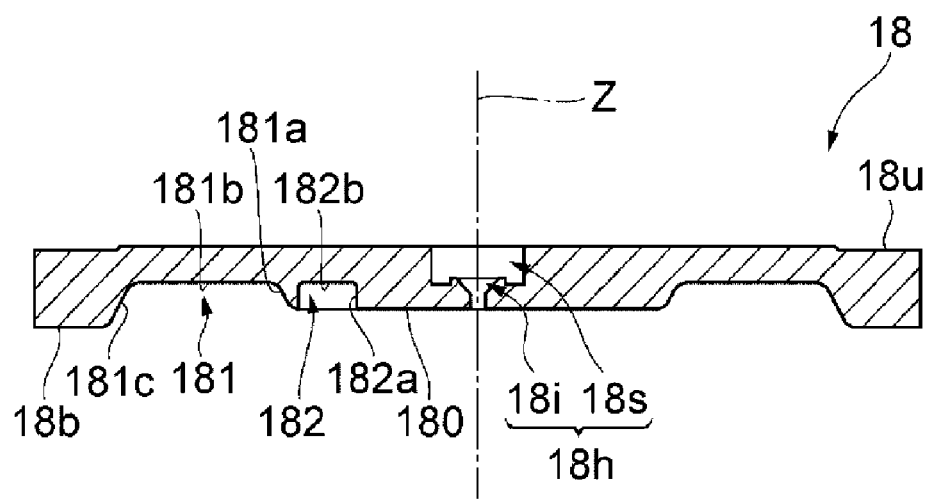
FIG. 4 is a cross sectional view taken along a line IX-IX of FIG. 3.

FIG. 3 is a plane view illustrating an example of a dielectric window, and illustrates a status of the dielectric window when viewed from the processing space S. FIG. 4 is a cross sectional view taken along a line IX-IX of FIG. 3. The dielectric window 18 has a substantial disc shape and is made of a dielectric material such as quartz or alumina. On an upper surface 18*u* of the dielectric window 18, the slot plate 44 is provided.

A through hole 18*h* is formed at a central portion of the dielectric window 18. An upper portion of the through hole 18*h* serves as a space 18*s* for accommodating the injector 50*b* of the central inlet unit 50 to be described later, and a lower portion thereof serves as a central inlet opening 18*i* of the central inlet unit 50 to be described later. Further, a central axis line of the dielectric window 18 is identical with the axis line Z.

An opposite surface to the upper surface 18*u* of the dielectric window, i.e., a lower surface 18*b* of the dielectric window is in contact with the processing space S and plasma is generated at the side of the lower surface 18*b*. In the lower surface 18*b*, various shapes are formed. To be specific, the lower surface 18*b* includes a planar surface 180 at a central portion surrounding the central inlet opening 18*i*. The planar surface 180 is a flat surface orthogonal to the axis line Z. In the lower surface 18*b*, a first recess portion 181 is annularly and continuously formed such that a sidewall thereof tapers upwardly in the plate thickness direction of the dielectric window 18.

The first recess portion 181 includes an inner tapered surface 181*a*, a bottom surface 181*b*, and an outer tapered surface 181*c*. The bottom surface 181*b* is formed at the side of the upper surface 18*u* rather than at the planar surface 180, and annularly extends in parallel with the planar surface 180. The inner tapered surface 181*a* annularly extends between the planar surface 180 and the bottom surface 181*b*, and is inclined with respect to the planar surface 180. The outer tapered surface 181*c* annularly extends between the bottom surface 181*b* and a periphery of the lower surface 18*b* and is inclined with respect to the bottom surface 181*b*. Further, a peripheral portion of the lower surface 18*b* is a surface in contact with the sidewall 12*a*.

Figure 5:
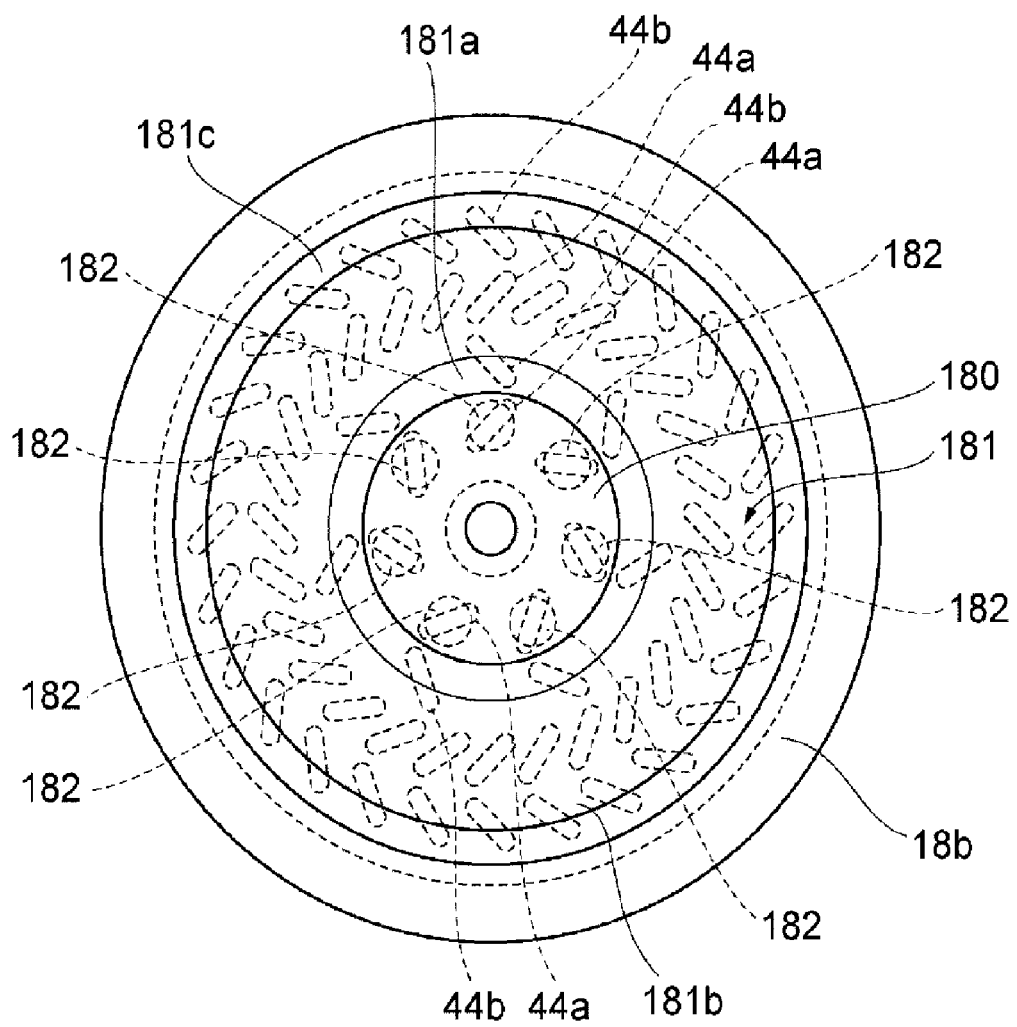
FIG. 5 is a plane view illustrating a status where the slot plate illustrated in FIG. 2 is provided on the dielectric window illustrated in FIG. 3.

Further, in the lower surface 18*b*, multiple second recess portions 182 are formed to be upwardly recessed in the plate thickness direction from the planar surface 180. The number of the multiple second recess portions 182 is seven in the example embodiment as illustrated in FIG. 3 and FIG. 5. These multiple second recess portions 182 are equally spaced along the circumferential direction thereof. Further, each of the multiple second recess portions 182 has a circular shape when viewed from the plane on a surface orthogonal to the axis line Z. To be specific, an inner surface 182*a* of the second recess portion 182 is a cylindrical surface extending in the axis line Z direction. Further, a bottom surface 182*b* of the second recess portion 182 is formed at the side of the upper surface 18*u* rather than at the planar surface 180, and is a circular surface parallel with the planar surface 180.

FIG. 5 is a plane view illustrating a status where the slot plate illustrated in FIG. 2 is provided on the dielectric window illustrated in FIG. 3, and illustrates a status of the dielectric window 18 when viewed from the bottom. As illustrated in FIG. 5, when viewed from the plane, i.e., when viewed from the axis line Z direction, the multiple slot holes 44*a* and the multiple slot holes 44*b* belonging to the outer slot pair group OSP, and the multiple slot holes 44*b* belonging to the inner slot pair group ISP are overlapped with the first recess portion 181. To be specific, when viewed from the plane, a portion of each slot hole 44*b* belonging to the outer slot pair group OSP is overlapped with the outer tapered surface 181*c*, and the other portion thereof is overlapped with the bottom surface 181*b*. Furthermore, when viewed from the plane, the multiple slot holes 44*a* belonging to the outer slot pair group OSP are overlapped with the bottom surface 181*b*. Moreover, when viewed from the plane, a portion of each slot hole 44*b* belonging to the inner slot pair group ISP is overlapped with the inner tapered surface 181*a*, and the other portion thereof is overlapped with the bottom surface 181*b*.

Further, when viewed from the plane, i.e., when viewed from the axis line Z direction, each of the multiple slot holes 44*a* belonging to the inner slot pair group ISP is overlapped with each of the second recess portion 182. To be specific, when viewed from the plane, the center of the bottom surface of each second recess portion 182 is positioned within each slot hole 44*a* belonging to the inner slot pair group ISP.

Referring to FIG. 1 again, in the plasma processing apparatus 10, a microwave generated by the microwave generator 32 is propagated toward the dielectric plate 42 through the coaxial waveguide 16, and is applied to the dielectric window 18 from the slot holes 44*a* and 44*b* of the slot plate 44.

In the dielectric window 18, as described above, a plate thickness of a portion in which the first recess portion 181 is formed and a plate thickness of a portion in which the second recess portion 182 is formed are smaller than a plate thickness of the other portions. Therefore, in the dielectric window 18, a microwave transmittance becomes high at these portions in which the first recess portions 181 and the second recess portions 182 are formed. Further, when viewed from the axis line Z direction, the slot holes 44*a* and 44*b* belonging to the outer slot pair group OSP and the slot holes 44*b* belonging to the inner slot pair group ISP are overlapped with the first recess portion 181, and each of the slot holes 44*a* belonging to the inner slot pair group ISP is overlapped with each of the second recess portion 182. Therefore, electric fields of the microwave are concentrated on the first recess portion 181 and the second recess portions 182, so that microwave energy is concentrated on the first recess portion 181 and the second recess portions 182. As a result, it is possible to stably generate plasma at the first recess portion 181 and the second recess portions 182, and also possible to allow plasma right under the dielectric window 18 to be stably distributed in the diametrical direction and the circumferential direction.

Further, the plasma processing apparatus 10 includes the central inlet unit 50 and a peripheral inlet unit 52. The central inlet unit 50 includes a pipe 50*a*, the injector 50*b*, and the central inlet opening 18*i*. The pipe 50*a* passes through an inner hole of the internal conductor 16*b* of the coaxial waveguide 16. Further, an end of the pipe 50*a* extends to the inside of the space 18*s* (see FIG. 4) of the dielectric window 18 along the axis line Z. Within the space 18*s* and under the end of the pipe 50*a*, the injector 50*b* is provided. The injector 50*b* includes multiple through holes extending in the axis line Z direction. Further, in the dielectric window 18, the central inlet opening 18i is formed. The central inlet opening 18i is continuous under the space 18s and extends along the axis line Z. The central inlet unit 50 described above is configured to supply a gas to the injector 50b through the pipe 50a and discharges the gas from the injector 50b through the central inlet opening 18i. As such, the central inlet unit 50 discharges the gas toward right under the dielectric window 18 along the axis line Z. That is, the central inlet unit 50 introduces the gas to a plasma generation region having a high electron temperature.

The peripheral inlet unit 52 includes multiple peripheral inlet openings 52i. The multiple peripheral inlet openings 52i mainly supply a gas toward an edge portion of the wafer W. The multiple peripheral inlet openings 52i are oriented to the edge portion of the wafer W or a periphery portion of the mounting region MR. The multiple peripheral inlet openings 52i are arranged along the circumferential direction between the central inlet opening 18i and the mounting table 20. That is, the multiple peripheral inlet openings 52i are annularly arranged around the axis line Z at a region (plasma diffusion region) having a lower electron temperature than right under the dielectric window. The peripheral inlet unit 52 supplies a gas toward the wafer W from the region having the low electron temperature. Therefore, it is possible to allow a dissociation degree of the gas introduced into the processing space S from the peripheral inlet unit 52 to be lower than a dissociation degree of the gas introduced into the processing space S from the central inlet unit 50.

Figure 6:
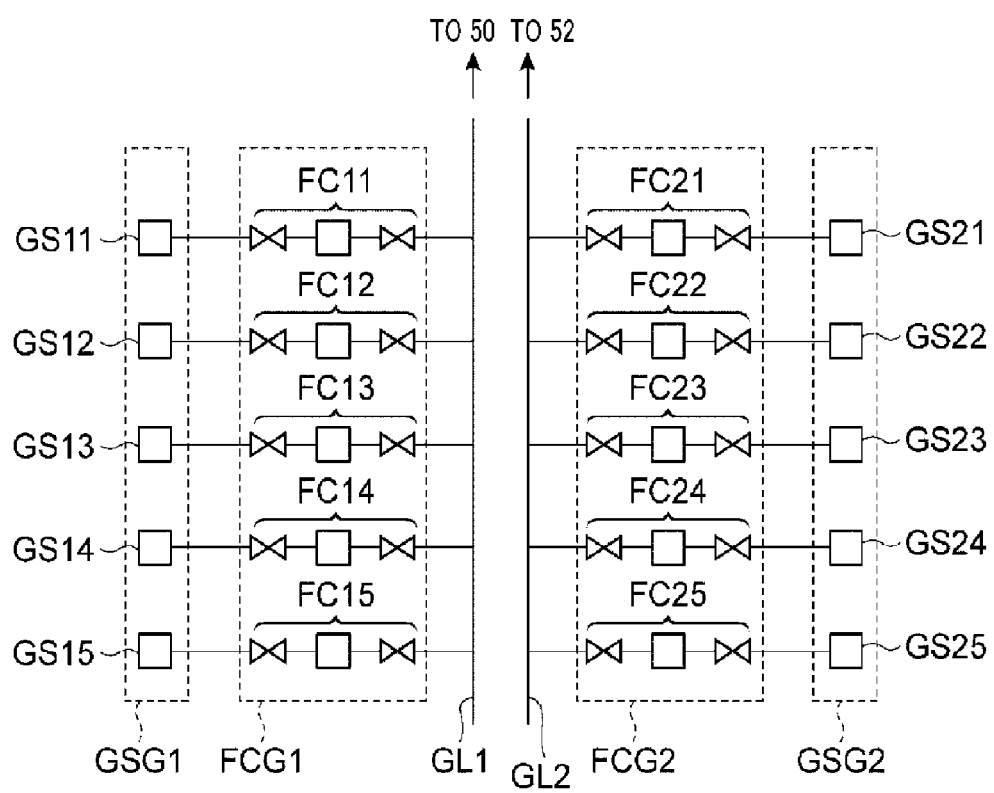
FIG. 6 illustrates a gas supply system including a first flow rate control unit group, a first gas source group, a second flow rate control unit group, and a second gas source group.

The central inlet unit 50 is connected to a first gas source group GSG1 via a first flow rate control unit group FCG1. Further, the peripheral inlet unit 52 is connected to a second gas source group GSG2 via a second flow rate control unit group FCG2. FIG. 6 illustrates a gas supply system including the first flow rate control unit group, the first gas source group, the second flow rate control unit group, and the second gas source group. As illustrated in FIG. 6, the first gas source group GSG1 includes multiple first gas sources GS11 to GS15. The first gas sources GS11 to GS15 are an Ar gas source, a He gas source, a $C_4H_6$ gas source, a $CH_3F$ gas source, and an $O_2$ gas source, respectively. The first gas source group GSG1 may further include a gas source different from these gas sources.

The first flow rate control unit group FCG1 includes multiple first flow rate control units FC11 to FC15. Each of the multiple first flow rate control units FC11 to FC15 includes, for example, two valves and a flow rate controller provided between the two valves. The flow rate controller is, for example, a mass flow controller. The multiple first gas sources GS11 to GS15 are connected to a common gas line GL1 via the multiple first flow rate control units FC11 to FC15, respectively. The common gas line GL1 is connected to the central inlet unit 50.

The second gas source group GSG2 includes multiple second gas sources GS21 to GS25. The second gas sources GS21 to GS25 are an Ar gas source, a He gas source, a $C_4H_6$ gas source, a $CH_3F$ gas source, and an $O_2$ gas source, respectively. The second gas source group GSG2 may further include a gas source different from these gas sources.

The second flow rate control unit group FCG2 includes multiple second flow rate control units FC21 to FC25. Each of the multiple second flow rate control units FC21 to FC25 includes, for example, two valves and a flow rate controller provided between the two valves. The flow rate controller is, for example, a mass flow controller. The multiple second gas sources GS21 to GS25 are connected to a common gas line GL2 via the multiple second flow rate control units FC21 to FC25, respectively. The common gas line GL2 is connected to the peripheral inlet unit 52.

As such, in the plasma processing apparatus 10, the multiple first gas sources and the multiple first flow rate control units are provided only for the central inlet unit 50. Further, the multiple second gas sources and the multiple second flow rate control units, which are independent of these multiple first gas sources and multiple first flow rate control units, are provided only for the peripheral inlet unit 52. Therefore, it is possible to independently control a kind of a gas to be introduced into the processing space S from the central inlet unit 50 and a flow rate of one or more gases to be introduced into the processing space S from the central inlet unit 50. Further, it is also possible to independently control a kind of a gas to be introduced into the processing space S from the peripheral inlet unit 52 and a flow rate of one or more gases to be introduced into the processing space S from the peripheral inlet unit 52.

In the example embodiment, the plasma processing apparatus 10 may further include a control unit Cnt as illustrated in FIG. 1. The control unit Cnt may be a control device such as a programmable computer device. The control unit Cnt may control each component of the plasma processing apparatus 10 according to a program based on a recipe. By way of example, the control unit Cnt may transmit control signals to the multiple first flow rate control units FC11 to FC15 to control a kind of a gas and a flow rate of the gas to be supplied to the central inlet unit 50. Further, the control unit Cnt may transmit control signals to the multiple second flow rate control units FC21 to FC25 to control a kind of a gas and a flow rate of the gas to be supplied to the peripheral inlet unit 52. Furthermore, the control unit Cnt may supply control signals to the microwave generator 32, the high frequency power supply RFG, and the exhaust device 30 to control the microwave power, power and ON/OFF of RF bias, and a pressure within the processing chamber 12. Moreover, the control unit Cnt may transmit control signals to the heater power supply connected to the heaters HT, HS, HC, and HE to adjust temperatures of these heaters.

In the example embodiment, the peripheral inlet unit 52 may further include an annular line 52p. This annular line 52p includes multiple peripheral inlet openings 52i. The annular line 52p may be made of, for example, quartz. As illustrated in FIG. 1, the annular line 52p is provided along an inner surface of the sidewall 12a in the example embodiment. In other words, the annular line 52p is not provided on a path connecting a lower surface of the dielectric window 18 with the mounting region MR, i.e., the wafer W. Therefore, the annular line 52p does not suppress diffusion of plasma. Further, since the annular line 52p is provided along the inner surface of the sidewall 12a, damage of the annular line 52p caused by plasma can be suppressed and a frequency of exchanging the annular line 52p can be reduced. Furthermore, since the annular line 52p is provided along the sidewall 12a of which a temperature can be controlled by a heater, it is possible to improve stability of a temperature of a gas to be introduced into the processing space S from the peripheral inlet unit 52.

Further, in the example embodiment, the multiple peripheral inlet openings 52i are open to the edge portion of the wafer W. That is, the multiple peripheral inlet openings 52i are inclined with respect to the flat surface orthogonal to the axis line Z to discharge a gas toward the edge portion of the wafer W. Since the peripheral inlet openings 52i are inclined and open to the edge portion of the wafer W as such, active species of the gas discharged from the peripheral inlet openings 52*i* directly head toward the edge portion of the wafer W. Thus, the active species of the gas can be supplied to the edge portion of the wafer W without being deactivated. As a result, it is possible to reduce nonuniformity in a processing rate of each portion in a diametrical direction of the wafer W.

(Plasma Processing Method)

Hereinafter, the plasma processing method will be explained.

As described above, in the plasma processing apparatus 10 of FIG. 1, the wafer (substrate) W is provided within the processing chamber 12 and a processing gas for etching is supplied into the processing chamber 12 through each of the central inlet unit 50 and the peripheral inlet unit 52. At a position spaced away from the wafer W, the dielectric window 18 is provided. At the lower surface of the dielectric window 18, the processing gas is excited with the microwave to generate the surface wave plasma. The processing gas excited into plasma is induced by the high frequency bias potential and reaches the wafer W, and the first layer and the second layer of the wafer W are etched. Plasma processing conditions for the etching are as follows.

First layer to be processed: layer containing Si and N
Second layer to be processed: layer containing Si and N
Gas kind G50 to be supplied to central inlet unit 50: gas including hydro fluorocarbon gas, rare gas, and oxygen gas
Gas kind G52 to be supplied to peripheral inlet unit 52: gas including hydro fluorocarbon gas, rare gas, and oxygen gas
Frequency of high frequency power supply RFG: about 13.56 MHz
Amplitude of high frequency potential of high frequency power supply RFG with respect to ground: about 130 to about 350 V
Power density PD of high frequency power supply RFG: about 0 W/m$^2$≤PD≤about 400 W/m$^2$
Microwave frequency of microwave generator 32: about 2.45 GHz
Pressure within processing chamber 12: about 1 atm.
Each of the first layer and the second layer may be made of SiN$_X$, SiCN, SiON, or SiOCN.

The hydro fluorocarbon gas included in the gas kinds G50 or G52 may include CHF$_3$, CH$_2$F$_2$, or CH$_3$F, which may be used alone or in combination. Further, the gas kinds G50 or G52 may include a fluorocarbon gas such as C$_4$F$_6$. Fluorocarbon may contain carbon and fluorine at a certain ratio as long as it contains carbon and fluorine. Further, if fluorocarbon is dissociated by plasmarization, an active species (C$_x$F$_y$ active species) is generated, and if hydro fluorocarbon is dissociated, an active species of hydrogen is generated.

The rare gas included in the gas kinds G50 or G52 may include Ar, He, Xe, or Kr, which may be used alone or in combination.

Under the above-described preconditions, experiment conditions are as follows. Further, as for silicon nitride constituting the first layer and the second layer, a stoichiometric composition of a general crystal thereof is Si$_3$N$_4$, but considering that composition ratios may be different, it will be expressed by SiN$_X$.

Experimental Example 1

First layer to be processed: SiN$_X$
Second layer to be processed: SiN$_X$

Gas kind G50 to be supplied to central inlet unit 50:
   CH$_3$F (flow rate=about 2.3 sccm)
   Ar (flow rate=about 10 sccm)
   O$_2$ (flow rate=about 1.6 sccm)
Gas kind G52 to be supplied to peripheral inlet unit 52:
   CH$_3$F (flow rate=about 42.7 sccm)
   Ar (flow rate=about 190 sccm)
   O$_2$ (flow rate=about 30.4 sccm)
Power density PD of high frequency power supply RFG: about 0 W/m$^2$ The number of samples is four. The first layer may be formed by a chemical vapor deposition (CVD) method, and the second layer may be formed by a low-pressure CVD (LPCVD) method or a molecular layer deposition (MLD) method. Further, even if an ALD method is used instead of the MLD method, a volume density becomes equivalent as compared with the CVD method.

(1) CVD Method

Conditions for the CVD method of forming the first layer are as follows.

In the CVD method, SiH$_4$ and NH$_3$ are used as raw materials, and Ar and N$_2$ are used as carrier gases. A pressure within the chamber is set to be about 30 mTorr (=about 4 Pa), a temperature of the substrate is set to be about 200° C., about 300° C., and about 400° C., and a total time for forming the first layer is set to be about 80 seconds. A thickness of the formed first layer is about 50 nm.

Further, a manufacturing apparatus used in the CVD method is a plasma CVD apparatus using a radial slot antenna and manufactured by Tokyo Electron Limited. A basic structure of this apparatus is the same as that of the above-described plasma processing apparatus, and a power of the microwave of about 13.56 MHz is set to be about 4000 W, and a power of the high frequency bias voltage of 400 kHz to be applied to the substrate is set to be about 100 W.

(2) LPCVD Method

Conditions for the LPCVD method of forming the second layer are as follows.

By the LPCVD method, the second layer is formed at a substrate temperature of about 700° C. The second layer is formed to have a thickness of about 250 nm. The substrate temperature may be set to be higher than about 700° C., for example, about 750° C.

(3) MLD Method

Conditions for the MLD method of forming the second layer are as follows.

In a manufacturing apparatus performing the MLD method, a Si source gas and a nitriding gas are alternately supplied to the substrate to form silicon nitride (SiN$_X$). In the MLD method, dichlorosilane (DCS: SiH$_2$Cl$_2$) having an excellent adsorption is used as the Si source, and ammonia (NH$_3$) is used as the nitriding gas. Ammonia is first supplied into the chamber at a flow rate of about 1000 sccm for about 2.5 minutes (at the pressure of about 700 Pa), and the exhaustion is carried out until the pressure within the chamber becomes about 250 Pa or less, and then, DSC is supplied at a flow rate of about 1000 sccm for about 3.5 minutes (at the pressure of about 700 Pa). This deposition cycle is repeated until a thickness of the second layer reaches about 50 nm.

(4) ALD Method

Further, by the ALD method, the second layer may be formed. The ALD method has a short deposition cycle as compared with the MLD method. However, in the same manner as the MLD method, the Si source gas and the nitriding gas are alternately supplied to the substrate to form silicon nitride (SiN$_X$). By way of example, dichlorosilane (DCS: SiH$_2$Cl$_2$) is used as the Si source, and plasmarized ammonia (NH$_3$) is used as the nitriding gas. The plasmarized ammonia is first adsorbed onto a surface of the substrate, and DCS is supplied. This deposition cycle is repeated. A forming temperature is set to be about 300° C. to about 600° C., and a pressure is set to be about 10 Pa to about 100 Pa. By way of example, a gas supplying time may be set to be about 2 seconds to about 4 seconds in each cycle. This deposition cycle can be repeated until a thickness of the second layer reaches about 50 nm.

Further, for example, conditions for each sample are as follows. Furthermore, a density of hydrogen DH of each sample depends on a temperature of a substrate while each layer is formed. As the temperature is increased, the density of hydrogen is decreased (a (volume) density of each layer is increased).

(Sample 1: Second Layer)
Forming method: LPCVD method
Forming temperature: about 700° C.
Density of hydrogen DH: about $4 \times 10^{21}$ cm$^{-3}$
(Sample 2: Second Layer)
Forming method: MLD method
Forming temperature: about 550° C.
Density of hydrogen DH: about $9 \times 10^{21}$ cm$^{-3}$
(Sample 3: First Layer)
Forming method: CVD method
Forming temperature: about 400° C.
Density of hydrogen DH: about $19 \times 10^{21}$ cm$^{-3}$
(Sample 4: First Layer)
Forming method: CVD method
Forming temperature: about 200° C.
Density of hydrogen DH: about $22 \times 10^{21}$ cm$^{-3}$ Experimental Example 2

In the experimental example 2, the power density PD of the high frequency power supply RFG is set to be about 310 W/m$^2$ in the experimental example 1.

Comparative Example 1

In the comparative example 1, the power density PD of the high frequency power supply RFG is set to be about 520 W/m$^2$ in the experimental example 1.

Comparative Example 2

In the comparative example 2, the power density PD of the high frequency power supply RFG is set to be about 1040 W/m$^2$ in the experimental example 1.

In accordance with this plasma processing method, when the surface wave plasma is used, a hydro fluorocarbon gas and an oxygen gas contained in the processing gas react with Si and N contained in the first layer and the second layer to etch these layers.

Although the experimental examples 1 and 2 and the comparative examples 1 and 2 are applied to a partial process (a process of removing a cap insulating layer) of a manufacturing process of a fin-type MOS field effect transistor, an experimental result of the etching will be explained first, and then, the partial process will be explained later for clarity of explanation.

Experimental Result

Figure 9:
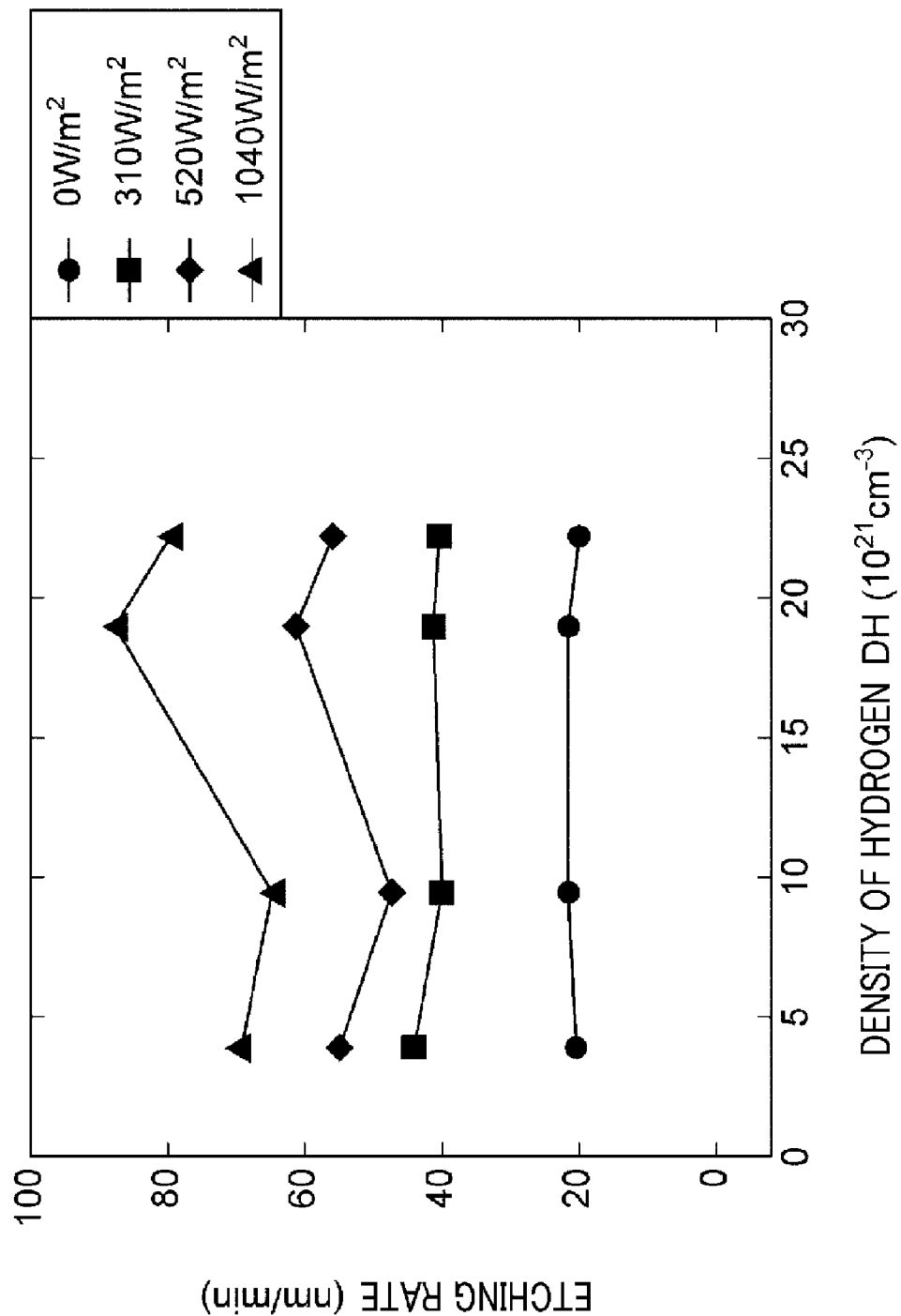
FIG. 9 is a graph showing a relationship between a density of hydrogen DH ($10^{21}$ cm$^{-3}$) and an etching rate ER (nm/min)

FIG. 9 is a graph showing a relationship between the etching rate ER (nm/min) and the density of hydrogen DH ($10^{21}$ cm$^{-3}$) within the first layer and the second layer. Further, in the actual experiments, the etching is carried out for about 15 seconds, and the graph shows an etched amount for about 1 minute by quadrupling an etched amount for about 15 seconds.

The SiN$_X$ constituting the first layer and the second layer is produced using ammonia (NH$_3$). Accordingly, when a density of a film is low, a hydrogen atom is bonded to another atom instead of constituent elements (Si, N), so that, a density of hydrogen is increased. Further, when the density of the film is high, the density of hydrogen is decreased.

In the experimental examples 1 and 2 and the comparative examples 1 and 2, the ranges of the etching rate (ER) are as follows.

Experimental example 1: about 20.0 nm/min ≤ ER ≤ about 21.6 nm/min
Experimental example 2: about 39.8 nm/min ≤ ER ≤ about 43.9 nm/min
Comparative example 1: about 47.0 nm/min ≤ ER ≤ about 61.2 nm/min
Comparative example 2: about 64.9 nm/min ≤ ER ≤ about 87.5 nm/min Further, variation amounts VE in the etching rate ER (=maximum value of etching rate ER−minimum value thereof) are as follows.

Experimental example 1: VE ≤ about 1.6 nm/min
Experimental example 2: VE ≤ about 4.1 nm/min
Comparative example 1: VE ≤ about 14.2 nm/min
Comparative example 2: VE ≤ about 22.6 nm/min In the experimental example 1 and the experimental example 2, the variation amounts VE in the etching rate at a certain range of the density of hydrogen DH (about $4 \times 10^{21}$ cm$^{-3}$ to about $22 \times 10^{21}$ cm$^{-3}$) are small. On the other hand, in the comparative example 1 and the comparative example 2, the variation amounts VE in the etching rate at a certain range of the density of hydrogen DH (about $4 \times 10^{21}$ cm$^{-3}$ to about $22 \times 10^{21}$ cm$^{-3}$) are increased. In particular, in the comparative examples 1 and 2, if the density of hydrogen DH is increased, i.e., the volume density is decreased (sparse), the etching rate ER is increased.

In the experimental examples 1 and 2, since the power per unit area (power density) PD for applying the high frequency bias potential is set to be about 0 W/m$^2$ ≤ PD ≤ about 400 W/m$^2$, the first layer (samples 3 and 4) and the second layer (samples 1 and 2) having different densities (compositions) can be etched at the same etching rates. If the power density PD is in the above-described range, the variation amount VE in the etching rate in a certain density range can be suppressed to an upper limit UL1 of about 4.1 nm/min or less. As a result, it is possible to achieve a technical advantage that multiple SiN$_X$ films having different film properties can be etched at the substantially same etching rate. Further, the certain density range refers to the density of hydrogen DH of about $4 \times 10^{21}$ cm$^{-3}$ to about $22 \times 10^{21}$ cm$^{-3}$. As for recent electronic devices, desirably, the variation amount VE in the etching rate is suppressed to the upper limit UL1 in view of quality control. That is, in the experiments, desirably, the power density PD needs to satisfy the range of about 0 W/m$^2$ ≤ PD ≤ about 310 W/m$^2$.

Further, if the power density PD is about 400 W/m$^2$, although there are no experimental data, it is possible to obtain an etching rate ER by supplementing data. This etching rate ER is lower than a mean value of the data of the comparative example 1 and the data of the experimental example 2 at a target density of hydrogen. It is presumed that in this case, the variation amount VE in the etching rate in a certain density range may not be suppressed to the above-described upper limit UL1 or less. However, the variation amount VE may be sufficiently smaller than that of the comparative example 1. Further, even in this case, it is possible to manufacture a high-quality electronic device as compared with the comparative examples.

Hereinafter, a forming process of a metal gate of a transistor including a process of removing a cap insulating layer will be briefly explained. The above experiments are carried out using this process.

FIG. 7A to FIG. 7F are diagrams for explaining a forming process of a metal gate using the plasma processing method.

Figure 7A:
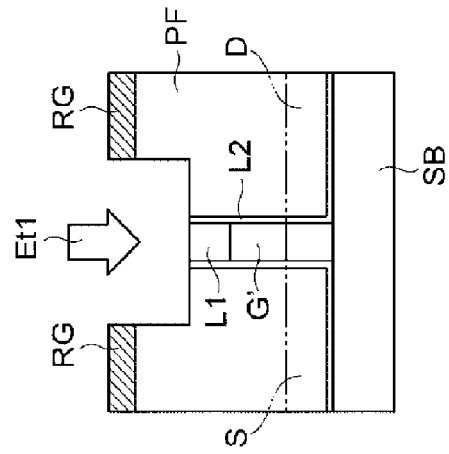
FIG. 7A to FIG. 7F are diagrams for explaining a manufacturing process of a metal gate using a plasma processing method.

As shown in FIG. 7A, a fin-type semiconductor conductive region is formed on a surface of a substrate made of silicon. One end of the semiconductor conductive region serves as a source region S, and the other end thereof serves as a drain region. The semiconductor conductive region can be formed by using a well-known lithography technology.

On a substrate SB, a dummy gate electrode G' to be removed later is formed. The gate electrode G' is made of polysilicon formed by the CVD method, and it is a gate uprightly provided on the substrate SB. On a top surface of the gate electrode G', a first layer L1 serving as a cap insulating layer is formed by the CVD method. These can also be formed by a well-known lithography technology.

Surfaces of a structure including the gate electrode G' and the first layer L1 and the substrate SB are coated with a second layer L2 formed by the ALD method. Further, if necessary, a portion of the second layer L2 positioned right on the first layer L1 is removed by an appropriate dry etching or ion milling. Furthermore, between the gate electrode G' and the fin-type semiconductor conductive region including the source region S and the drain region D, a gate insulating layer is provided.

Figure 7B:
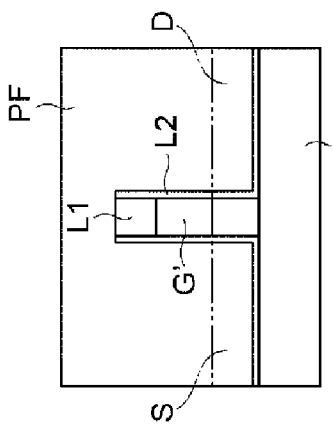

Then, as shown in FIG. 7B, an insulating layer PF is deposited until the structure is fully buried to cover the substrate SB and the structure including the gate. The insulating layer PF is made of $SiO_2$ and formed by the CVD method. In the CVD method of forming $SiO_2$, silane ($SiH_4$), tetraethoxysilane [Si($OC_2H_3$)$_4$], or silicon tetrachloride ($SiCl_4$) is used as a raw material of Si, and $O_2$ or $O_3$ is used as a raw material of oxygen.

Figure 7C:
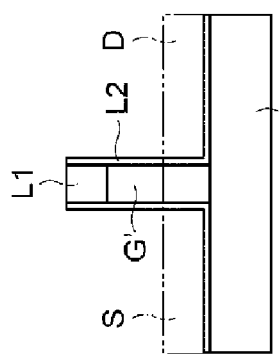

Then, as shown in FIG. 7C, a resist RG is patterned on the insulating layer PF, and a part of the insulating layer PF is etched with the resist RG as a mask until the first layer L1 is exposed. Examples of the etching method may include a wet etching method using HF or a dry etching method such as an ion milling method using Ar and a reactive ion etching method. In an etching process Et1 of the present example embodiment, a dry etching method using $CHF_3$ as an etching gas is performed.

Figure 7D:
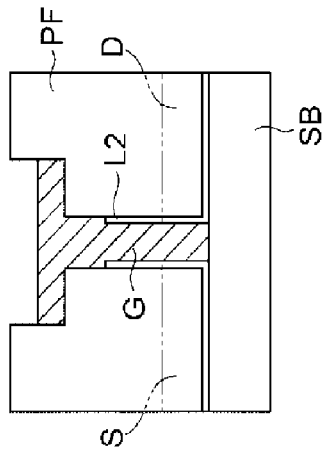

Thereafter, as shown in FIG. 7D, the first layer L1 and the second layer L2 are etched at the same time by the above-described plasma processing method. By this etching process Et2, the first layer L1 and the second layer L2 can be etched at the same etching rates ER. In particular, since this etching process uses the surface wave plasma, a flatness of the etched surface may become high. In this etching process, $SiN_X$ is removed, but the insulating layer PF is not removed. This etching process is carried out until the first layer L1 is completely removed and the top surface of the gate electrode G' (or a surface of an etching stopper film) is exposed.

Figure 7E:
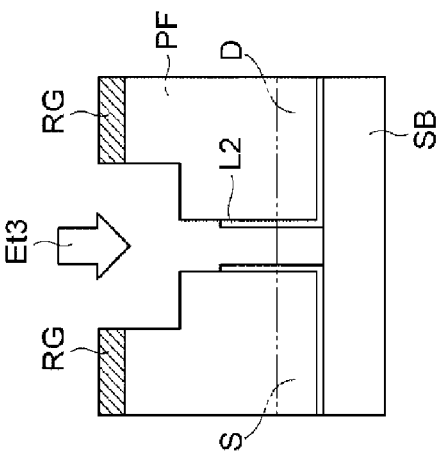

Then, as shown in FIG. 7E, the gate electrode G' made of polysilicon is removed by an etching process Et3. The etching process of the polysilicon is carried out by using $Ar/HBr/O_2$. Here, the second layer L2 is not removed but remains.

Figure 7F:
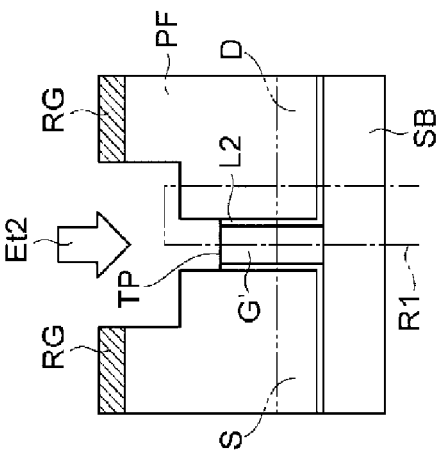

Finally, as shown in FIG. 7F, a metal is buried in a hole from which the polysilicon is removed, so that a gate electrode G is completed. The gate electrode G is made of TiN, TaN, Al, W, etc., and formed by a sputtering method or the CVD method.

Figure 8A:
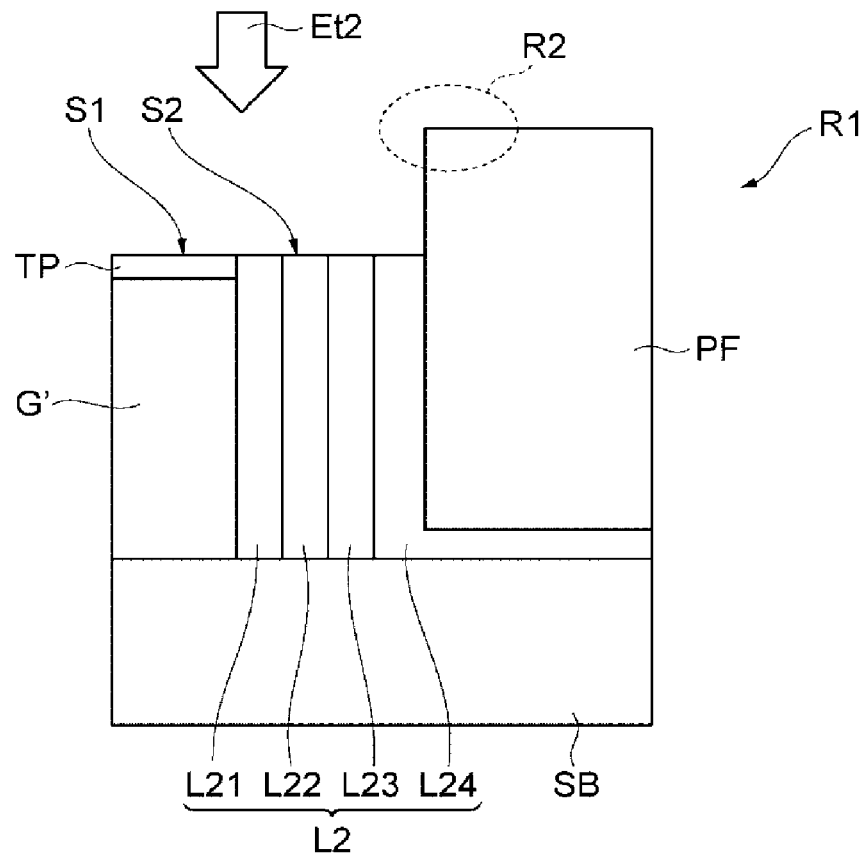
FIG. 8A is an enlarged view of a region R1 in an experimental example.
Figure 8B:
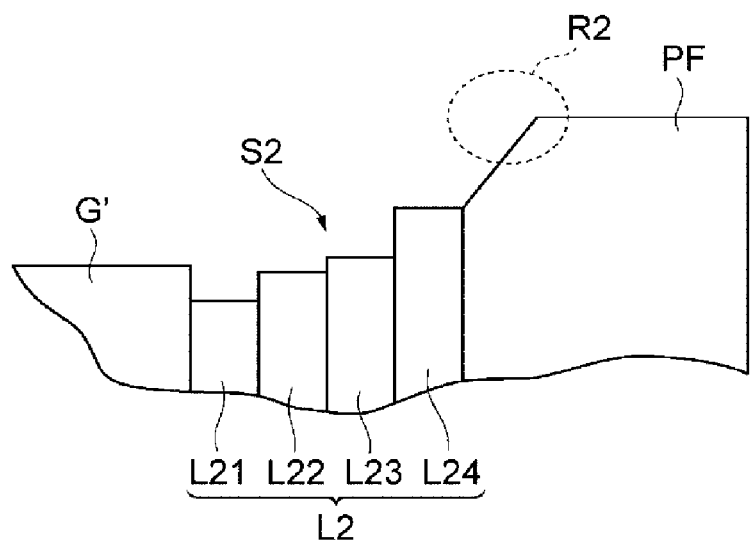
FIG. 8B is a partially enlarged view of an element in a comparative example.

FIG. 8A is an enlarged view of a region R1 in the experimental example, and FIG. 8B is a partially enlarged view of the element in the comparative example.

In accordance with the plasma processing method of the present experimental example, the plasmarized active species for the etching react with the first layer and the second layer, so that the first layer L1 and the second layer L2 are etched at the same etching rates to allow the etched and exposed surface to be flat (FIG. 8A).

Further, on the top surface of the gate electrode G' made of polysilicon, an etching stopper film TP may be formed. Thus, it becomes easy to stop the etching at a desired position. The etching stopper film TP may be made of the same material ($SiO_2$) as the insulating layer PF. Since the insulating layer PF is not etched in the present plasma process, an edge denoted by a region R2 is maintained in a sharp shape. That is, in the etching process using the present plasma process, if ions of the active species are vertically collided with the $SiN_X$ surface, the ions may not be collided with a side surface of the $SiO_2$ and the power density (energy) thereof is relatively low. Therefore, a shape of the edge can be maintained, and the etching selectivity of $SiN_X$ with respect to $SiO_2$ can be increased.

Meanwhile, as shown in FIG. 8B, if the etching process is carried out by using an inductively coupled plasma etching method, the edge of the insulating layer PF is etched and an exposed surface of the second layer L2 is not uniformly etched. If the edge is not sharp, this may cause the malfunction of the device.

The second layer L2 includes multiple insulating layers L21, L22, L23, and L24 which are formed by the ALD method or the MLD method, and stacked in parallel on a main surface of the substrate SB. Ions can be implanted into the substrate SB via the second layer L2. If the exposed surface of the second layer L2 is flat, ions can be implanted with high controllability.

The above-described method can be applied even to a MOS field effect transistor which does not have a fin structure but has a cross sectional structure including the first layer and the second layer as shown in FIG. 7A to FIG. 7F.

As explained above, the plasma processing method includes: (1) the process of preparing the substrate SB on which the first layer L1 and the second layer L2 having different densities are formed; (2) the process of arranging the substrate SB within the processing chamber 12 and introducing the processing gas for etching into the processing chamber 12; and (3) the process of generating the surface wave plasma by exciting the processing gas with the microwave at a position spaced away from the substrate SB and etching the first layer L1 and the second layer L2 at the same time with the plasmarized processing gas.

Further, both of the first layer L1 and the second layer L2 contain Si and N, and the processing gas includes a hydro fluorocarbon gas, a rare gas, and an oxygen gas. During the etching process, the high frequency bias potential is applied to a certain location at the side of the substrate such that the plasmarized processing gas is directed toward the substrate and the power per unit area of the substrate, which generates the high frequency bias potential, is about 0 W/m$^2$ or more to about 400 W/m$^2$ or less.

Furthermore, in the above-described example embodiment, the forming method of the first layer L1 may be different from the forming method of the second layer L2. That is, the first layer L1 and the second layer L2 may have different densities and can be formed by different forming methods.

Moreover, in the above-described example embodiment, the forming method of the first layer L1 may be the chemical vapor deposition (CVD) method, and the forming method of the second layer L2 may be the atomic layer deposition (ALD) method or the molecular layer deposition (MLD) method. The first layer L1 and the second layer L2 respectively formed by these methods may have different densities. Along with the development of the semiconductor device manufacturing technology, products manufactured by these different forming methods have been increased. In this case, the present plasma processing method is more useful.

Further, in the above-described example embodiment, as shown in FIG. 7A to FIG. 7F, a first insulating layer formed on the top surface of the gate uprightly provided on the substrate SB serves as the first layer L1 and a second insulating layer adjacent to the side surfaces of the gate serves as the second layer L2, and all of the first layer L1 and a part of the second layer L2 are removed by the etching process.

The fin-type transistor includes the fin-type semiconductor conductive region and the gate electrode G extended in a direction orthogonal to a longitudinal direction of the semiconductor conductive region. While the gate electrode G is formed, the first insulating layer (first layer L1) is formed as a cap on the top surface of the dummy gate electrode G' corresponding to the gate electrode G by the CVD method, and the second insulating layer (second layer L2) is formed at the side surfaces of the gate electrode by the ALD method or the MLD method. Then, until the first insulating layer is removed, these layers are etched at the same time to remove all of the first insulating layer and a part of the second insulating layer. Thus, when forming this structure, the present example embodiment may be effectively applicable.

Based on the principle that the first layer and the second layer can be etched at the same etching rates, even if a first region and a second region having different densities are present within a single layer, these regions can also be etched at the same etching rates in like manner.

Figure 10:
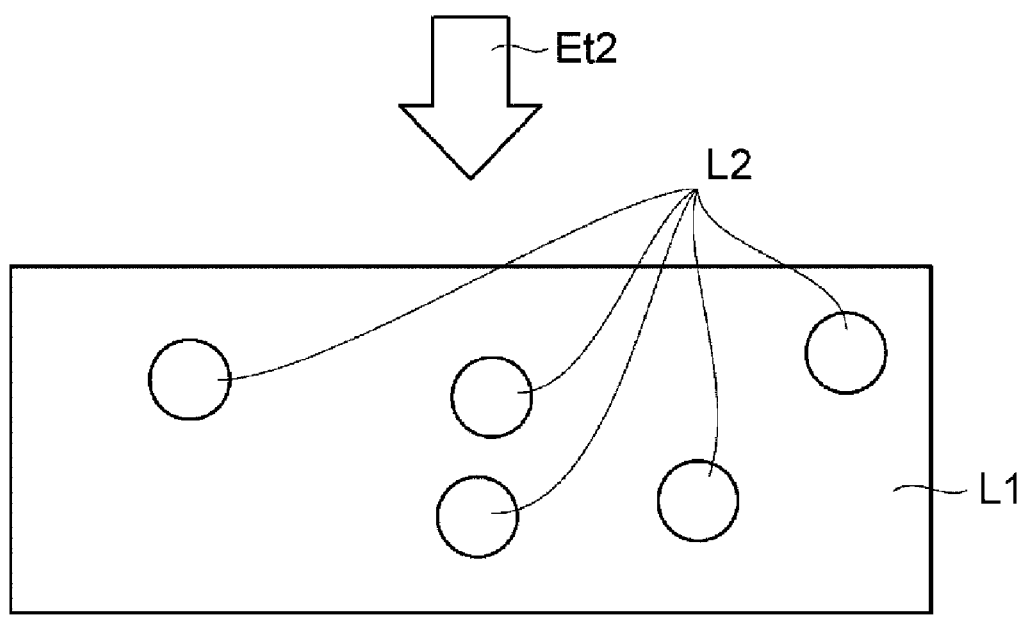
FIG. 10 is a diagram illustrating a layer including a first region L1 and a second region L2 having different densities.

FIG. 10 is a diagram illustrating a layer including a first region L1 and a second region L2 having different densities (compositions).

Within the single layer, a first region L1 as a main portion of a layer constituting the substrate and a second region L2 dispersed within the layer are present. In this case, if the above-described plasma processing method is applied, the first region L1 and the second region L2 can be etched at the same etching rate. That is, this substrate is provided as the wafer W in the above-described plasma processing apparatus, and the above-described plasma process can be performed thereon. The configuration, the materials, the effect, the function, and the method of the above-described example embodiment can be applied to the present example embodiment.

As explained above, the plasma processing method of this example embodiment includes: (1) the process of preparing the substrate having the layer that includes the first region L1 and the second region L2 having different densities; (2) the process of arranging the substrate within the processing chamber 12 and introducing the processing gas for etching into the processing chamber 12; and (3) the process of generating the surface wave plasma by exciting the processing gas with the microwave at a position spaced away from the substrate and etching the layer with the plasmarized processing gas.

Further, both of the first region L1 and the second region L2 contain Si and N, and the processing gas includes a hydro fluorocarbon gas, a rare gas, and an oxygen gas. During the etching process, the high frequency bias potential is applied to a certain location at the side of the substrate such that the plasmarized processing gas is directed toward the substrate, and the power per unit area of the substrate PD, which generates the high frequency bias potential, is about 0 W/m$^2$ or more to about 400 W/m$^2$ or less.

In accordance with this plasma processing method, when the surface wave plasma is used, the hydro fluorocarbon gas and the oxygen gas contained in the processing gas react with the Si and N contained in the first region L1 and second region L2 to etch these regions. Herein, since the power per unit area (power density) for applying the high frequency bias potential is set to be the preset range as described above, the first region L1 and second region L2 having different densities can be etched at the same etching rates.

Further, even if the power (power density) PD is about 0 W/m$^2$, the effect can be obtained in view of the etching rate. However, if the surfaces of the first layer and the second layer to be etched are in a bad surface state due to oxidation or the like, it is difficult to carry out an etching process with sufficient anisotropy. Therefore, desirably, the power density PD needs to be greater than about 0 W/m$^2$ to about 400 W/m$^2$ or less. That is, more desirably, the power density PD needs to satisfy the range of about 0 W/m$^2$<PD≤about 400 W/m$^2$. Further, as the power density PD is increased, the variation amount VE in the etching rate ER is increased. Accordingly, the power density PD needs to satisfy, desirably, PD≤about 350 W/m$^2$, and more desirably, PD≤about 310 W/m$^2$. Furthermore, in the above-described case, if the power density PD is low, the anisotropy characteristic may be decreased. As a result, from this practical view, the power density PD needs to satisfy, desirably, about 10 W/m$^2$<PD, and more desirably, about 50 W/m$^2$<PD.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A plasma processing method comprising:
    preparing a substrate on which a first layer and a second layer having different densities are formed;
    arranging the substrate within a processing chamber and introducing a processing gas for etching into the processing chamber; and
    generating surface wave plasma by exciting the processing gas with a microwave at a position spaced away from the substrate and etching the first layer and the second layer at the same time with the plasma while maintaining an etching surface of the first layer and an etching surface of the second layer are positioned on a same plane,
    wherein both of the first layer and the second layer contain Si and N,
    the processing gas includes a hydro fluorocarbon gas, a rare gas, and an oxygen gas,
    during the etching of the first layer and the second layer, a high frequency bias potential is applied to a predetermined location at a side of a substrate such that the plasmarized processing gas is directed toward the substrate, and
    a power per unit area of the substrate, which generates the high frequency bias potential, is about 0 W/m$^2$ or more to about 400 W/m$^2$ or less.

2. The plasma processing method of claim 1,
wherein a forming method of the first layer is different from a forming method of the second layer.

3. The plasma processing method of claim 2,
wherein the forming method of the first layer is a chemical vapor deposition (CVD) method, and the forming method of the second layer is an atomic layer deposition (ALD) method or a molecular layer deposition (MLD) method.

4. The plasma processing method of claim 1,
wherein a first insulating layer formed on a top surface of a gate uprightly provided on the substrate serves as the first layer, a second insulating layer adjacent to side surfaces of the gate serves as the second layer, and all of the first layer and a part of the second layer are removed by the etching.

* * * * *